United States Patent
Philpott et al.

(10) Patent No.: US 9,939,827 B1
(45) Date of Patent: Apr. 10, 2018

(54) TEMPERATURE DEPENDENT POWER SUPPLY CIRCUITRY

(75) Inventors: Justin Jon Philpott, San Francisco, CA (US); Ping-Chen Liu, Fremont, CA (US); Ravi Thiruveedhula, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 1880 days.

(21) Appl. No.: 13/328,917

(22) Filed: Dec. 16, 2011

(51) Int. Cl.
*G05F 1/56* (2006.01)
*G05F 3/22* (2006.01)
*G05F 1/00* (2006.01)
*G05F 1/46* (2006.01)
*H02M 1/32* (2007.01)
(Continued)

(52) U.S. Cl.
CPC ............... *G05F 1/56* (2013.01); *G05F 3/225* (2013.01); *G01K 3/005* (2013.01); *G01K 7/425* (2013.01); *G05F 1/00* (2013.01); *G05F 1/463* (2013.01); *H01L 27/0248* (2013.01); *H02H 7/1213* (2013.01); *H02M 1/32* (2013.01); *H03M 3/322* (2013.01)

(58) Field of Classification Search
CPC .......... G05F 1/463; G05F 1/465; G05F 1/567; G05F 1/575; G05F 1/56; G05F 3/225; G05F 3/30; G01P 3/48; H03M 3/00; H03M 3/322; H03M 3/502; G01K 1/00; G01K 7/01; G01K 7/021; G01K 7/20; G01K 7/425; G01K 1/026; G01K 3/005; G11C 5/147; H03K 17/14; H03K 17/30; H03K 19/1732; H02H 7/1213; H02M 1/32; H02M 3/157; H02M 3/33507; H02M 3/073; H01L 27/0248
USPC ........................ 323/280; 374/100; 327/515
See application file for complete search history.

(56) References Cited

U.S. PATENT DOCUMENTS 4,298,835 A 11/1981 Rowe
4,613,768 A 9/1986 Pommer, II
(Continued)

OTHER PUBLICATIONS

Perisetty et al., U.S. Appl. No. 12/551,289, filed Aug. 31, 2009.

*Primary Examiner* — Fred E Finch, III
*Assistant Examiner* — Demetries A Gibson
(74) *Attorney, Agent, or Firm* — Treyz Law Group, P.C.; Tianyi He

(57) ABSTRACT

An integrated circuit having power supply circuitry configured to generate a temperature dependent power supply voltage is provided. The power supply circuitry may include temperature sensors formed at different regions on the integrated circuit. The power supply circuitry may use a selected one of the temperature sensors to vary the temperature dependent power supply voltage. The power supply circuitry may include voltage clamping circuitry configured to clip the power supply voltage to an upper fixed voltage level when the power supply voltage exceeds a first predetermined threshold and to clip the power supply voltage to a lower fixed voltage level when the power supply voltage falls below a second predetermined threshold. The power supply circuitry may also include voltage overshoot-undershoot protection circuitry configured to keep the temperature dependent power supply voltage within a specified voltage range in the presence of transient perturbations in the temperature dependent power supply voltage.

21 Claims, 11 Drawing Sheets

(51) Int. Cl.
*H03M 3/00* (2006.01)
*G01K 7/42* (2006.01)
*G01K 3/00* (2006.01)
*H01L 27/02* (2006.01)
*H02H 7/12* (2006.01)

(56) References Cited

U.S. PATENT DOCUMENTS

| | | | | |
|---|---|---|---|---|
| 5,650,719 A | * | 7/1997 | Moody | G01D 3/02 324/166 |
| 5,654,861 A | * | 8/1997 | Pennisi | H02H 5/044 361/103 |
| 6,107,866 A | * | 8/2000 | Migliavacca | G05F 3/267 327/539 |
| 6,147,908 A | * | 11/2000 | Abugharbieh | G11C 16/30 365/185.2 |
| 6,265,858 B1 | * | 7/2001 | Park | 323/313 |
| 7,589,584 B1 | | 9/2009 | Bui | |
| 7,639,067 B1 | * | 12/2009 | Perisetty | H02M 3/073 326/41 |
| 7,657,772 B2 | * | 2/2010 | Clabes | G01K 7/425 327/138 |
| 7,728,569 B1 | | 6/2010 | Le et al. | |
| 7,764,563 B2 | | 7/2010 | Tanzawa | |
| 2005/0052437 A1 | * | 3/2005 | Hudson | G01K 7/015 345/204 |
| 2006/0190210 A1 | * | 8/2006 | Mukherjee | G01K 1/026 702/130 |
| 2008/0049811 A1 | * | 2/2008 | Hirano | 374/100 |
| 2008/0164497 A1 | * | 7/2008 | von Borcke | H03K 17/14 257/252 |
| 2008/0174587 A1 | * | 7/2008 | Son | 345/211 |
| 2009/0110028 A1 | * | 4/2009 | Goh | G01K 3/005 374/185 |
| 2009/0122585 A1 | * | 5/2009 | Karasawa | H02M 3/1588 363/127 |
| 2009/0135866 A1 | * | 5/2009 | Nishimura | H01S 5/042 372/34 |
| 2009/0206807 A1 | * | 8/2009 | Imura | G05F 1/573 323/277 |
| 2009/0296779 A1 | * | 12/2009 | Lee | G01K 7/01 374/170 |
| 2009/0323400 A1 | * | 12/2009 | Shinozaki | G11C 11/413 365/154 |
| 2010/0128531 A1 | | 5/2010 | Lee et al. | |
| 2010/0164286 A1 | * | 7/2010 | Okano | 307/43 |

* cited by examiner

| S | R | O (352) | $\overline{O}$ (350) |
|---|---|---|---|
| 0 | 0 | KEEP | KEEP |
| 0 | 1 | 0 | 1 |
| 1 | 0 | 1 | 0 |
| 1 | 1 | NA | NA |

FIG. 11

TEMPERATURE DEPENDENT POWER SUPPLY CIRCUITRY

BACKGROUND

This relates to integrated circuits with power supply circuitry. Integrated circuits often contain volatile memory elements. Typical volatile memory elements are based on cross-coupled inverters (latches). Volatile memory elements retain data as long as the integrated circuit is powered. For example, integrated circuits may include volatile memory elements such as static random access memory (SRAM) cells.

Integrated circuits such as programmable integrated circuits may include volatile memory elements such as configuration random access memory (CRAM) cells that are loaded with configuration data. Each CRAM cell has an output that provides a control signal that is used to enable or disable a corresponding pass transistor in logic circuitry. Pass transistors (pass gates) are typically formed from n-channel transistors.

Pass transistors are turned on or off to selectively pass or block passage of logic signals in response to the control signals provided by the CRAM cells. In an effort to increase performance, pass transistors can be turned on using elevated gate control signals (i.e., by overdriving the gates of the pass transistors at an elevated voltage level greater than the nominal positive power supply voltage that is supplied to the remainder of the logic circuitry). To provide such overdriving capabilities, the power supply circuitry may supply the CRAM cells with an elevated positive power supply voltage.

Pass transistors overdriven in this way may, however, suffer from potential transistor breakdown and reliability issues. Metal-oxide-semiconductor field-effect transistors (MOSFETs) typically exhibit a gate breakdown voltage that varies with temperature. For example, a pass transistor may exhibit a breakdown voltage level of 1.1 V when the integrated circuit is operating at 20° C. and may exhibit a breakdown voltage level of 1.0 V when the integrated circuit is operating at 50° C. (i.e., the gate breakdown voltage level reduces as temperature increases).

Conventional ways of overdriving pass transistors involve biasing the gate of pass transistors to the same elevated positive power supply voltage level across all operating temperatures. If an integrated circuit is operating at temperatures below a given threshold, the pass transistors may function satisfactorily. If, however, the integrated circuit is operating at temperatures greater than the given threshold, the pass transistors may suffer from degraded breakdown voltage and may be overstressed, resulting in dielectric breakdown that renders the pass transistors inoperable.

SUMMARY

Integrated circuits may include power supply circuitry configured to generate a temperature dependent power supply voltage. For example, the temperature dependent power supply voltage may increase as temperature decreases and may decrease as temperature increases.

The power supply circuitry may include temperature sensors formed at different regions on an integrated circuit. Each of these temperature sensors may serve to generate a corresponding temperature dependent voltage signal reflective of the temperature of the regions at which they are respectively located on the integrated circuit. The power supply circuitry may include a multiplexing circuit configured to select one of the temperature dependent voltage signals for use in generating the temperature dependent power supply voltage.

In one suitable arrangement, the power supply circuitry may include clamp voltage generation and control circuitry. The clamp voltage generation and control circuitry may be used to generate first and second clamping voltages so that the temperature dependent power supply voltage cannot vary beyond the limit set by the first and second clamping voltages as temperature increases or decreases.

For example, if the selected temperature dependent voltage signal is less than the first clamping voltage and greater than the second clamping voltage, the temperature dependent power supply voltage may exhibit the same voltage level as the selected temperature dependent voltage signal. If the selected temperature dependent voltage signal exceeds the first clamping voltage, the temperature dependent power supply voltage will be clamped to the first clamping voltage. If the selected temperature dependent voltage signal is less than the second clamping voltage, the temperature dependent power supply voltage will be clamped to the second clamping voltage. Clipping the temperature dependent power supply voltage in this way may serve to prevent transistors from being overstressed (when temperatures are low) or understressed (when temperatures are high).

In another suitable arrangement, the power supply circuit may include voltage overshoot-undershoot protection circuitry. The voltage overshoot-undershoot protection circuitry may include a voltage reference generator configured to generated first and second voltage overshoot reference voltage levels and first and second voltage undershoot reference voltage levels and may include first and second comparator circuits operable to receive the overshoot and undershoot reference voltage levels, respectively. This type of protection circuitry may serve to reduce the amount of voltage overshoot and undershoot resulting from transient disturbances or parasitic coupling events (e.g., transient coupling events).

For example, if a transient event causes the temperature dependent power supply voltage to rise instantaneously and exceed the first overshoot reference voltage level, a pull-down transistor (e.g., an n-channel transistor) may be enabled to help pull the temperature dependent power supply voltage back down. When the temperature dependent power supply voltage falls below the second overshoot reference voltage level (which is less than the first overshoot reference voltage level), the pull-down transistor may be turned off. Similarly, if a transient event causes the temperature dependent power supply voltage to drop instantaneously and fall below the first undershoot reference voltage level, a pull-up transistor (e.g., a p-channel transistor) may be enabled to help pull the temperature dependent power supply voltage back up. When the temperature dependent power supply voltage exceeds the second undershoot reference voltage level (which is greater than the first undershoot reference voltage level), the pull-up transistor may be turned off.

Further features of the present invention, its nature and various advantages will be more apparent from the accompanying drawings and the following detailed description.

BRIEF DESCRIPTION OF THE DRAWINGS

FIG. 11 is a table showing illustrative values associated with the operation of set-reset latches of the type shown in FIG. 10 in accordance with an embodiment of the present invention.

DETAILED DESCRIPTION

Figure 1:
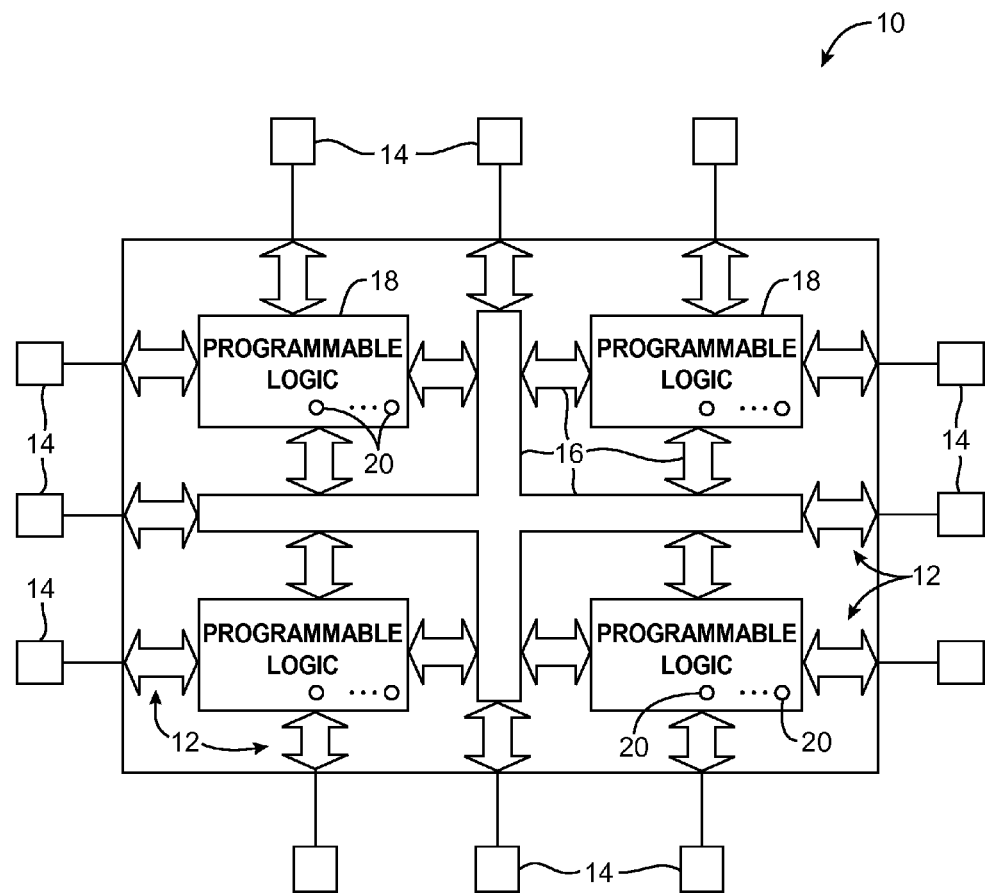
FIG. 1 is a diagram of an illustrative programmable integrated circuit in accordance with an embodiment of the present invention.

An illustrative integrated circuit of the type that may be provided with memory elements and associated circuits that can be controlled using output signals from the memory elements is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry (programmable logic) 18.

Because memory elements 20 may be used in storing configuration data for programmable logic 18, memory elements 20 may sometimes be referred to as configuration random-access memory elements (CRAM). Integrated circuit 10 may be configured to implement custom logic functions by configuring programmable logic 18, so integrated circuit 10 may sometimes be referred to as a programmable integrated circuit.

As shown in FIG. 1, programmable integrated circuit 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. The memory element output signals may, for example, be used to control the gates of metal-oxide-semiconductor (MOS) transistors such as n-channel metal-oxide-semiconductor (NMOS) pass transistors in programmable components such as multiplexers, logic gates such as AND gates, NAND gates, etc. P-channel transistors (e.g., a p-channel metal-oxide-semiconductor pass transistor) may also be controlled by output signals from memory elements 20, if desired. When a memory element output that is associated with an NMOS pass transistor is high, the pass transistor controlled by that memory element is turned on and passes logic signals from its input to its output. When the memory element output is low, an NMOS pass transistor is turned off and does not pass logic signals. P-channel metal-oxide-semiconductor (PMOS) pass transistors are turned on when the signal that is applied to its gate from the output of a memory element is low (e.g., 0 volts) and are turned off when the output of the memory element is high (i.e., the polarity for NMOS and PMOS control signals is reversed).

Configuration random-access memory elements 20 may be arranged in an array pattern. There may be, for example, millions of memory elements 20 on integrated circuit 10. During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10.

The circuitry of programmable integrated circuit 10 may be organized using any suitable architecture. As an example, the circuitry of programmable integrated circuit 10 may be organized in a series of rows and columns of programmable logic blocks (regions) each of which contains multiple smaller logic regions. The logic resources of integrated circuit 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the circuitry of programmable integrated circuit 10 may be arranged in more levels or layers in which multiple large regions are interconnected to form still larger portions of logic. Still other device arrangements may use logic that is not arranged in rows and columns.

Figure 2:
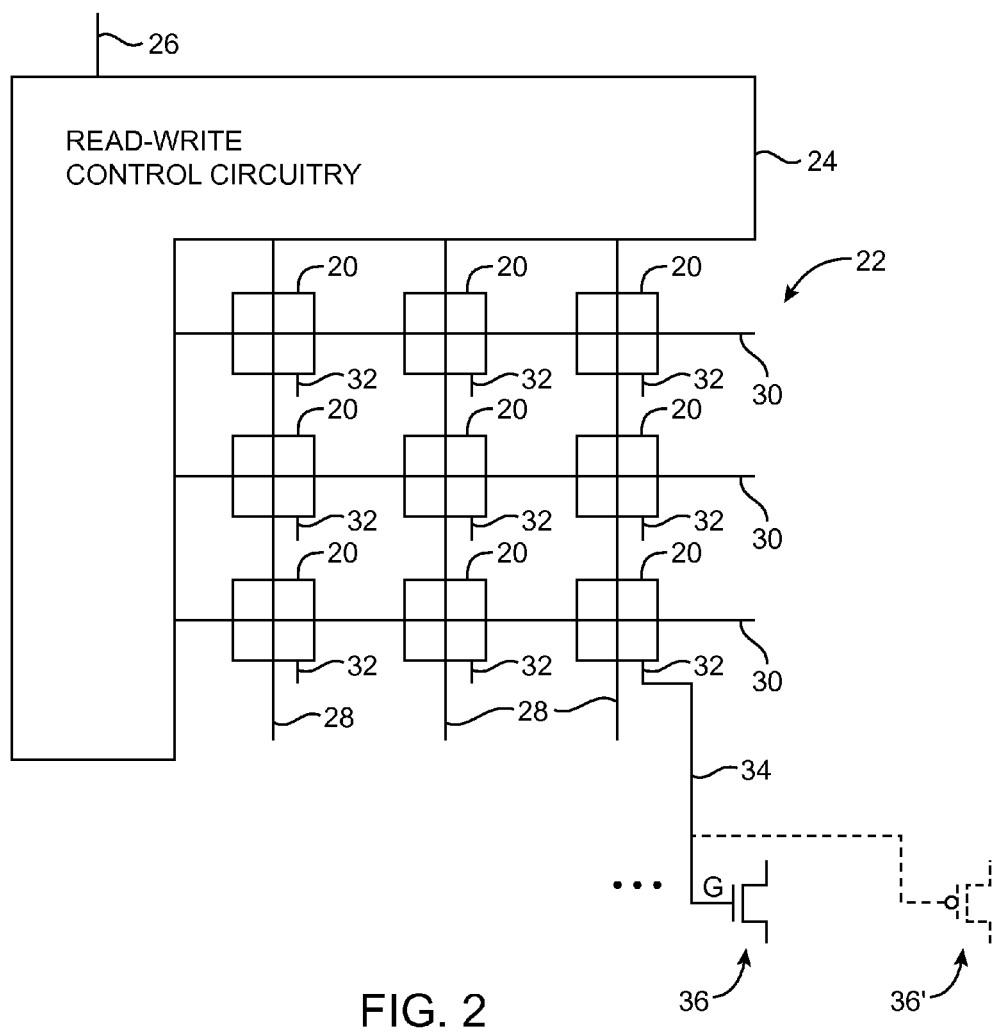
FIG. 2 is a diagram of illustrative memory circuitry in accordance with an embodiment of the present invention.

Horizontal and vertical conductive lines and associated control circuitry may be used to write data into the memory elements and may be used to read data from the memory elements. An illustrative arrangement that allows data to be written into and read from an array of memory elements is shown in FIG. 2. Illustrative array 22 of FIG. 2 has memory elements 20. Memory elements 20 may be volatile memory elements such as CRAM cells. Each memory element may have a corresponding output 32 with which a corresponding static output signal may be applied to the gate of a corresponding programmable transistor. For example, a path such as path 34 may be used to apply an output signal from the output 32 of a memory element 20 to a gate G of a corresponding programmable transistor (pass gate) such as pass gate 36. The programmable transistor may be an n-channel metal-oxide-semiconductor transistor such as transistor 36 of FIG. 2 or may be a p-channel metal-oxide-semiconductor transistor (see illustrative pass gate 36' of FIG. 2).

The arrangement of FIG. 2 has a 3×3 array 22 of memory elements 20. Device 10 may, if desired have more rows and columns (e.g., hundreds or thousands of rows and columns). A 3×3 array is used in FIG. 2 as an example.

Read-write control circuitry 24 may obtain data to be loaded into array 22 via path 26. Data that has been read from array 22 may be provided to path 26 from memory elements 20 by read-write control circuitry 24.

Control signals on one or more control lines 30 may be used to control reading and writing operations. For example, during writing and reading operations, signals on address lines in lines 30 (sometimes referred to as word lines) may be asserted to control associated address transistors. If desired, control lines 30 may include clear lines. A clear signal may be asserted on the clear lines when it is desired to clear the contents of the memory elements 20 in array 22 (e.g., when it is desired to clear all of the memory elements in a block of memory elements simultaneously).

Data lines 28 (sometimes referred to as bit lines) may be used in conveying data from read-write control circuitry 24 to memory elements 20 during data loading operations. Data lines 28 may also be used in conveying data from memory elements 20 to read-write control circuitry 24 during data reading operations. The memory elements that are selected during reading and writing operations may be controlled by the address lines (lines 30).

There may be any suitable number of address lines and data lines associated with each memory element 20. For example, each memory element (i.e., each row of memory elements) may be associated with a single address line that is used for controlling both reading and writing operations or may be associated with a write address line for use during write operations and a read address lines for use during read operations. One data line may be associated with each memory element (i.e., each column of memory elements) or a pair of complementary data lines may be associated with each memory element (as examples).

Figure 3:
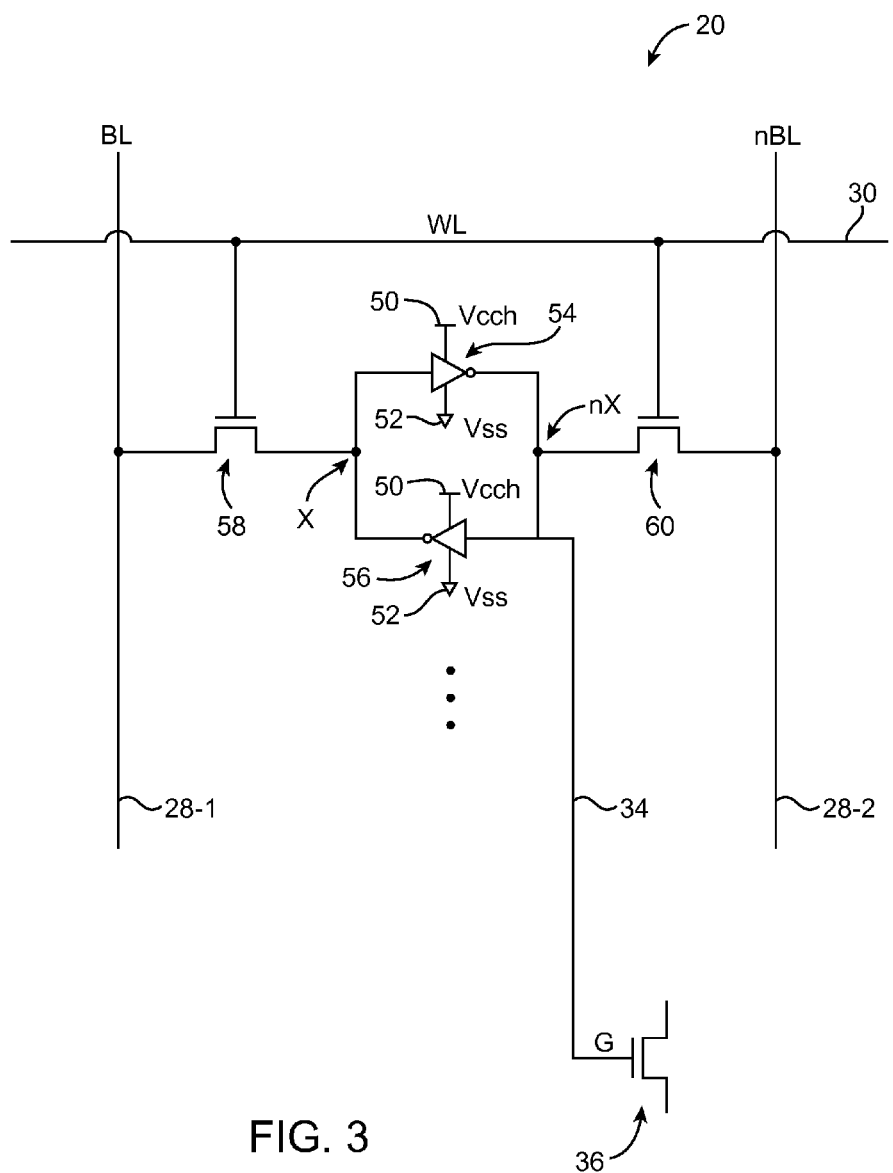
FIG. 3 is a circuit diagram of an exemplary memory cell in accordance with an embodiment of the present invention.

FIG. 3 shows an exemplary memory element 20 (sometimes referred to as memory cells). As shown in FIG. 3, memory cell 20 may include a storage circuit formed using a pair of cross-coupled inverters 54 and 56. Inverters 54 and 56 may each have an input and an output. The output of inverter 54 may be coupled to the input of inverter 56, whereas the output of inverter 56 may be coupled to the input of inverter 54. A storage circuit formed using this arrangement may be used to store a single bit of data and may sometimes be referred to as a bistable circuit or a latching circuit.

Inverters 54 and 56 may each have a first power supply terminal that is coupled to positive power supply line 50 (e.g., a positive power supply line on which power supply voltage Vcch is provided) and a second power supply terminal that is coupled to ground power supply line 52 (e.g., a ground line on which ground voltage Vss is provided). Power supply voltage Vcch may, in general, be greater than nominal positive power supply voltage Vcc that is used to power the remainder of circuits in programmable logic 18 and may vary in time depending on the current operating temperature of device 10. Power supply voltage Vcch may therefore sometimes be referred to as a temperature-dependent time-varying power supply voltage. Voltage Vss may be zero volts, 0.1 V, or −0.1 V (as examples).

The output of inverter 56 may serve as a first data storage node X for memory cell 20, whereas the output of inverter 54 may serve as a second data storage node nX for memory cell 20. True and complement versions of a single data bit may be stored on data storage nodes X and nX, respectively. For example, memory cell 20 may be configured to store a "1" (e.g., storage nodes X and nX may be high and low, respectively) and may be configured to stored a "0" (e.g., storage nodes X and nX may be low and high, respectively).

Memory cell 20 may include a first access transistor 58 that is coupled between first data storage node X and a first data line 28-1 (e.g., a first data line on which true data line signal BL is provided) and a second access transistor 60 that is coupled between second data storage node nX and a second data line 28-2 (e.g., a second data line on which complement data line nBL is provided). Data lines 28-1 and 28-2 may sometimes be referred to as bit lines. Access transistors 58 and 60 may each have a gate that is coupled to an associated address line 30 (e.g., a control line on which word line signal WL is provided). Access transistors 58 and 60 may therefore sometimes be referred to as address transistors, and address line 30 may sometimes be referred to as a word line.

During normal operation, signal WL is deasserted (e.g., word line signal WL is held low) to turn off access transistors 58 and 60 so that the storage portion of cell 20 holds stored data values at the first and second data storage nodes. For example, memory cell 20 holding a "0" may have first data storage node X at logic "0" and second data storage node nX at logic "1."

During read operations, data lines 28-1 and 28-2 may be precharged (e.g., data signals BL and nBL may be precharged to a high voltage). Word line signal WL may then be asserted (e.g., signal WL may then be raised high) to enable access transistors 58 and 60 for reading data out of the data storage nodes of memory cell 20. Sensing circuitry that is coupled to data lines 28-1 and 28-2 (not shown) may be used to determine whether memory cell 20 is storing a "0" (e.g., whether storage node X is currently low) or a "1" (e.g., whether storage node X is currently high).

During write operations, desired data values may be driven onto data lines 28-1 and 28-2 and word line signal WL may be asserted to enable access transistors 58 and 60 for passing the desired data values into the data storage nodes of memory cell 20. For example, signal BL on data line 28-1 may be driven high while signal nBL on data line 28-2 may be driven low to write in a "1" into memory cell 20.

As described in connection with FIG. 2, each memory cell 20 may supply an output signal on corresponding output path 34. Output path 34 may be coupled to data storage node nX. The output signal may be a static output control signal that is used in configuring corresponding transistor 36 (e.g., the output signal may be used to control the gate of corresponding transistor 36) or other circuit element in an associated programmable logic circuit. The state of transistor 36 (off or on) controls whether signals are allowed to pass between its source-drain terminals.

Memory cell 20 of FIG. 3 is merely illustrative and is not intended to limit the scope of the present invention. If desired, memory cell 20 may be formed using more than two cross-coupled inverter or inverter-like circuits, may include any number of access transistors, may include a clear transistor, may include read buffer transistors, may be formed using a multiport memory architecture, etc.

To increase the performance of pass transistor 36, power supply voltage Vcch that is supplied to memory cell 20 may be set to elevated levels that are greater than the nominal power supply voltage that is used to power the remainder of circuits on device 10. Overdriving pass transistor 36 by biasing its gate to elevated levels may serve to increase its drive strength.

Care should be taken to not overstress pass transistor 36. At lower temperatures, MOSFET devices may exhibit relatively robust gate breakdown tolerance (e.g., pass transistor 36 may be capable of receiving higher voltages at its gate without suffering from dielectric breakdown). At higher temperatures, however, MOSFET devices may exhibit degraded gate breakdown tolerance (e.g., pass transistor 36 is more susceptible to experience reliability issues such as dielectric breakdown when receiving elevated voltages at higher temperatures). It may therefore be desirable to be able to provide power supply circuitry configured to generate power supply voltage Vcch that is temperature dependent (e.g., to generate a time-varying power supply voltage that is higher at lower temperatures and lower at higher temperatures).

Figure 4:
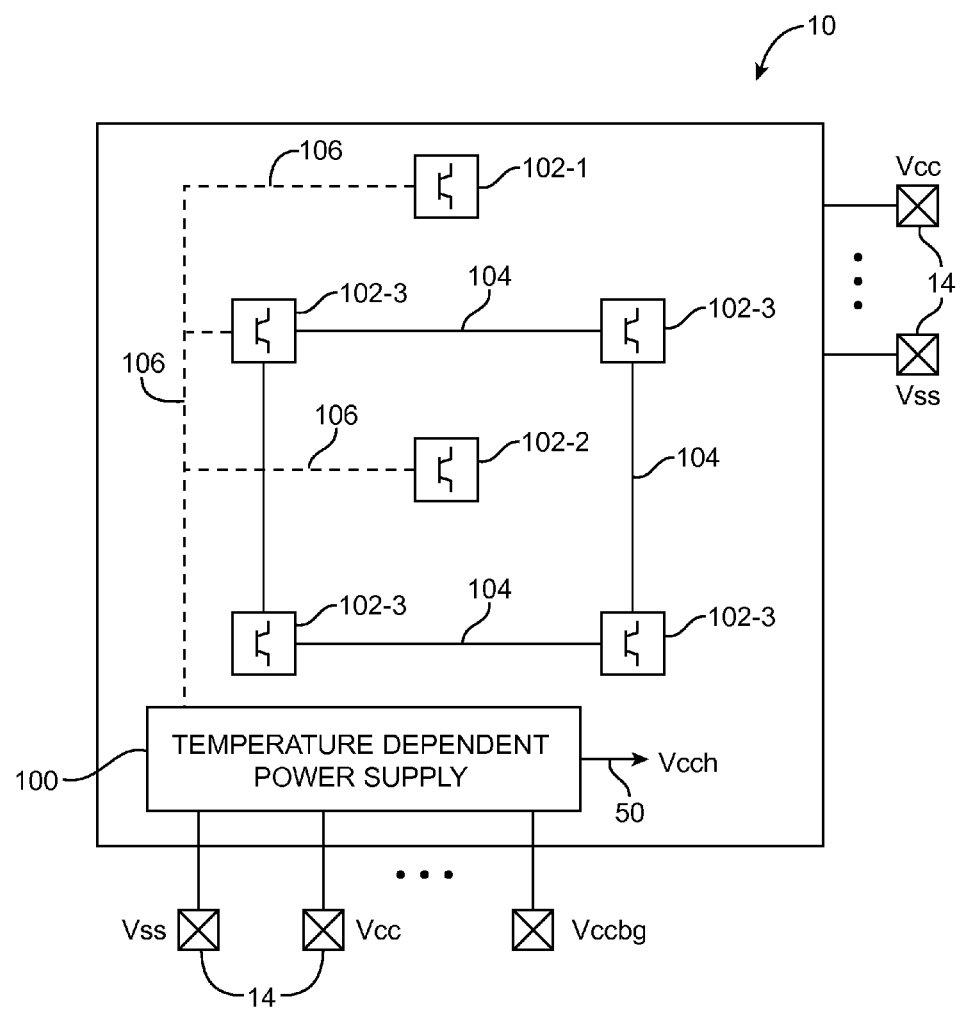
FIG. 4 is a diagram of an illustrative integrated circuit that includes temperature dependent power supply circuitry in accordance with an embodiment of the present invention.

Integrated circuit 10 may include temperature dependent power supply circuitry 100 operable to generate time-varying power supply voltage Vcch over power supply line 50 (see, e.g., FIG. 4). As shown in FIG. 4, device 10 may receive power supply voltages from external sources of power via input/output pins 14. In particular, power supply circuitry 100 may receive ground power supply voltage Vss, positive power supply voltages Vcc and Vccbg, and other suitable power supply voltages. As an example, ground power supply voltage Vss may be equal to zero volts, nominal power supply voltage Vcc may be equal to 0.85 V, and bandgap power supply voltage Vccbg may be equal to 2 V. If desired, Vss may be greater or less than zero volts, Vccbg may be greater or less than 2 V, and Vcc may be any suitable voltage that is less than Vccbg and greater than Vss.

Power supply circuitry 100 may be coupled to temperature sensors that are positioned at different locations on device 10 via path 106. In the example of FIG. 4, device 10 may include a first temperature sensor 102-1 formed near one of the edges of device 10, a second temperature sensor 102-2 formed near the center of device 10, and third temperature sensors 102-3 distributed evenly throughout device 10. Third temperature sensors 102-3 may be interconnected via lines 104 (e.g., third temperature sensors 102-3 may be coupled in parallel). Third temperature sensors 102-3 "lumped" together as a group in this way may collectively serve as one temperature sensor that provides a signal reflective of an average temperature measured across each of temperature sensors 102-3. Temperature sensors 102-1, 102-2, and 102-3 may be considered to be part of power supply circuitry 100.

The diagram of FIG. 4 is merely illustrative and does not serve to limit the scope of the present invention. More than one sensor 102-1 may be lumped near the edge of device 10 and sensors 102-1 may be formed near more than one edge of device 10. Similarly, more than one sensor 102-2 may be lumped near the center of device 10. There may be more than four or less than four temperature sensors 102-3 formed at various locations on device 10. In general, any number of groups of temperature sensors, each of which can contain one or many temperature sensors coupled in parallel, may be formed at any desired region in device 10 and may be distributed in any desired fashion throughout device 10.

Temperature sensors 102-1, 102-2, and 102-3 may be used to monitor the temperature of the regions at which the temperature sensors are respectively formed. Power supply circuitry 100 may selectively receive a temperature dependent voltage signal from one of temperature sensors 102-1, 102-2, and 102-3 when generating temperature dependent power supply voltage Vcch (e.g., power supply circuitry 100 may only take into account the temperature sensed by a selected one of temperature sensors 102-1, 102-2, and 102-3 when producing Vcch).

Figure 5:
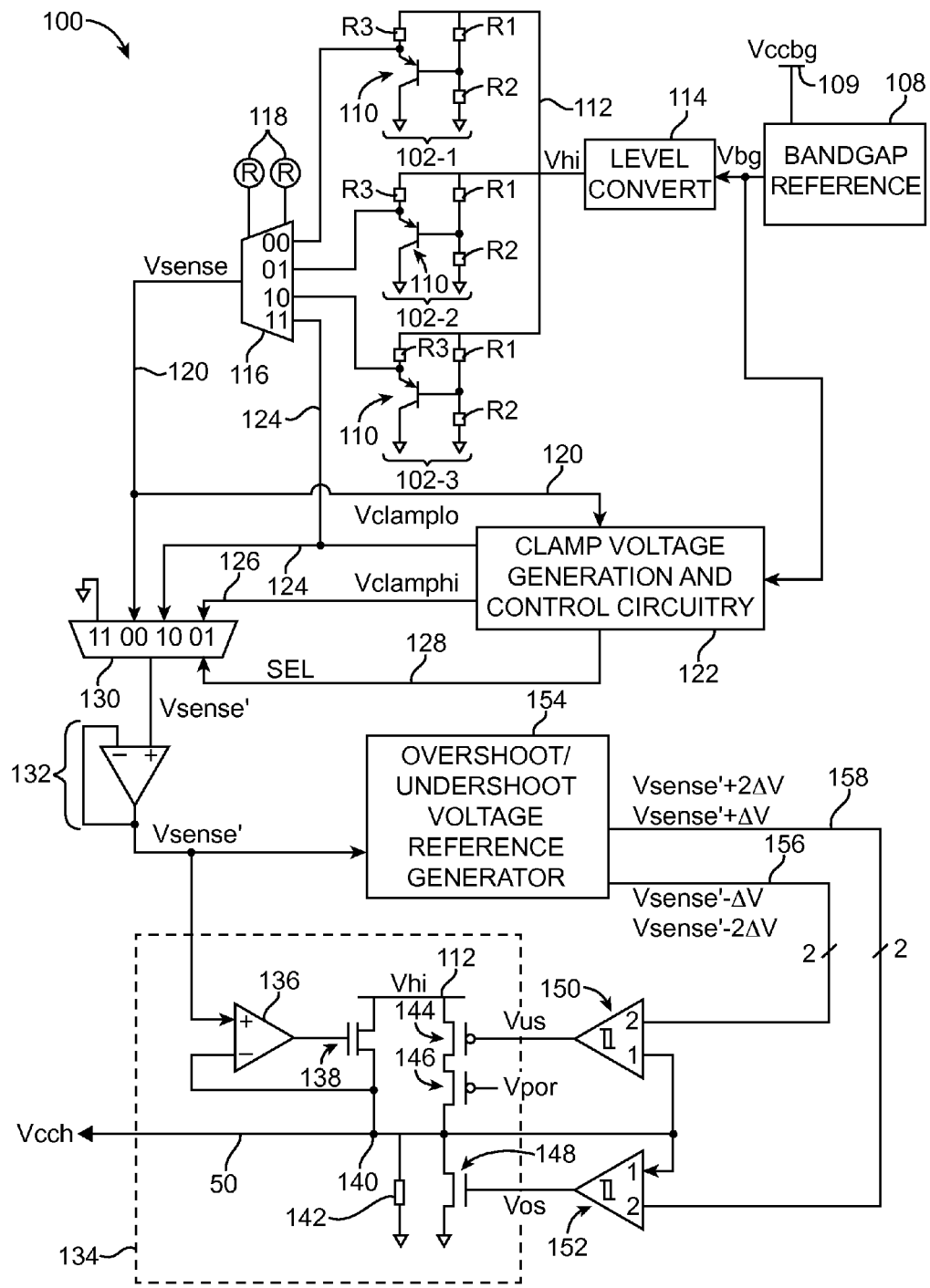
FIG. 5 is a circuit diagram of illustrative temperature dependent power supply circuitry in accordance with an embodiment of the present invention.

FIG. 5 is a circuit diagram showing one exemplary implementation of power supply circuitry 100. As shown in FIG. 5, power supply circuitry 100 may include a bandgap voltage reference circuit 108 that is used to generate a temperature independent voltage Vbg. Bandgap reference circuit 108 may be powered using bandgap power supply voltage Vccbg that is provided over line 109 and that is equal to 2 V (as an example). Voltage Vbg may be fed through a level converting circuit 114 to generate voltage Vhi over line 112. As an example, voltage Vbg may be equal to 1.2 V, whereas voltage Vhi may be equal to 1.5 V. Level converting circuit 114 that receives Vbg and that generates Vhi that is greater than Vbg may sometimes be referred to as a voltage step-up converter.

Temperature sensor 102-1 may include a PNP bipolar junction transistor (BJT) 110 and resistor R3 coupled in series between power supply line 112 (e.g., the power supply line on which Vhi is provided) and the ground line. In particular, BJT 110 may have an emitter terminal that is connected to resistor R3, a collector terminal that is connected to the ground line, and a base terminal. The node at which BJT 110 and R3 are connected may serve as an output for temperature sensor 102-1 on which a temperature dependent voltage signal is provided. Temperature sensor 102-1 may also include resistors R1 and R2 coupled in series between power supply line 112 and the ground line. The base terminal of BJT 110 may be coupled to an intermediate node at which resistors R1 and R2 are connected (e.g., resistors R1 and R2 serve as a biasing chain for BJT 110). As discussed previously, temperature sensor 102-1 shown in FIG. 5 may represent only one of multiple parallel-connected temperature sensors 102-1 that are formed near edges of device 10.

Temperature sensors 102-2 and 102-3 may be formed using a similar circuit arrangement as temperature sensor 102-1. Temperature sensor 102-2 shown in FIG. 5 may represent only one of many parallel-connected temperature sensors 102-2 that are formed near the center of device 10, whereas temperature sensor 102-3 shown in FIG. 5 may represent only one of many parallel-connected temperature sensors 102-3 that are distributed at various locations on device 10. If desired, there may only be one temperature sensor 102-1, one temperature sensor 102-2, and one temperature sensor 102-3 formed at respective locations on device 10.

Power supply circuitry 100 may include a multiplexing circuit 116 (sometimes referred to as a multiplexer) having a first (00) input configured to receive a first temperature dependent voltage signal from the output of first temperature sensor 102-1, a second (01) input configured to receive a second temperature dependent voltage signal from the output of second temperature sensor 102-2, a third (10) input configured to receive a third temperature dependent voltage signal from the output of third temperature sensor 102-3, a fourth (11) input configured to receive voltage signal Vclamplo over path 124, control inputs operable to receive control bits stored in memory elements 118, and an output 120. Memory elements 118 may use any suitable volatile and/or non-volatile memory structures such as RAM cells, fuses, antifuses, programmable read-only-memory memory cells, mask-programmed and laser-programmed structures, etc. Depending on the value of bits stored in memory elements 118, multiplexer 116 may be configured to route a voltage signal from a selected one of its inputs to its output 120. Voltage Vsense may be presented at output 120 of multiplexer 116.

In one suitable arrangement, multiplexer 116 may be configured to route the first temperature dependent voltage signal from its first input to its output (e.g., so that Vsense is equal to the first temperature dependent voltage signal generated using sensor 102-1). In another suitable arrangement, multiplexer 116 may be configured to route the second temperature dependent voltage signal from its second input to its output (e.g., so that Vsense is equal to the second temperature dependent voltage signal generated using sensor 102-2). In another suitable arrangement, multiplexer 116 may be configured to route the third temperature dependent voltage signal from its third input to its output (e.g., so that Vsense is equal to the third temperature dependent voltage signal generated using sensor 102-3). In a scenario in which none of the different temperature sensors is functioning properly, multiplexer 116 may be configured to route signal Vclamplo from its fourth input to its output 120. Voltage Vclamplo may exhibit a voltage level that is sufficiently low as to prevent overstressing pass transistor 36 regardless of the current operating conditions. Voltage Vclamplo may be equal to 0.9 V (as an example).

Power supply circuitry 100 may include a second multiplexer 130 having a first (00) input configured to receive Vsense from the output of multiplexer 116, a second (01) input configured to receive first clamping signal Vclamphi over path 126, a third (10) input configured to receive second clamping signal Vclamplo over path 124, a fourth input coupled to the ground line (e.g., the fourth input may be unused), a control input configured to receive control input signal SEL over path 128, and an output. Depending on the value of signal SEL, multiplexer 130 may be configured to route signals from a selected one of its inputs to its output.

Power supply circuitry 100 may include clamp voltage generation and control circuitry 122 that receives signal Vsense over path 120 and voltage Vbg and that may be used to generate signals Vclamphi, Vclamplo, and SEL. In one suitable arrangement when SEL is set to logic value "00," multiplexer 130 may be configured to route Vsense to its output (e.g., so that Vsense' is equal to Vsense). In another suitable arrangement when SEL is set to logic value "01," multiplexer 130 may be configured to route Vclamphi to its output (e.g., so that Vsense' is equal to Vclamphi). In another suitable arrangement when SEL is set to logic value "10," multiplexer 130 may be configured to route Vclamplo to its output (e.g., so that Vsense' is equal to Vclamplo).

To limit Vsense' within a desired voltage range as temperature varies, predetermined fixed voltages Vclamphi and Vclamplo may be used as upper and lower clipping voltages. For example, multiplexer 130 may be configured to route Vsense to its output when Vsense is greater than Vclamplo and less than Vclamphi. In response to detecting that Vsense is greater than Vclamphi using circuitry 122, multiplexer 122 may be configured to route Vclamphi to its output so that Vsense' is clamped to Vclamphi. In response to detecting that Vsense is less than Vclamplo using circuitry 122, multiplexer 122 may be configured to route Vclamplo to its output so that Vsense' is clamped to Vclamplo. Voltage Vclamphi may be equal to 1.1 V, whereas Vclamplo may be equal to 0.9 V (as an example).

Voltage Vsense' may be fed to a voltage regulating circuit 134 via a unity gain buffer circuit 132. Unity gain buffer 132 may be an amplifier circuit having a first differential input that is coupled to the output of multiplexer 130 and a second differential input that is coupled to its output.

Voltage regulating circuit 134 may include at least an amplifying circuit 136, n-channel transistors 138 and 148, p-channel transistors 144 and 146, and resistor 142. N-channel transistor 138 may be coupled between power supply line 112 (e.g., a power supply line on which voltage Vhi is provided) and node 140. Amplifier circuit 136 may have a first (positive) input that receives Vsense' from the output of unity gain buffer 132, a second (negative) input that is coupled to node 140, and an output that is coupled to the gate of transistor 138. Path 50 on which temperature dependent power supply voltage Vcch is provided may be coupled to node 140. Amplifier 136 coupled using this feedback arrangement may set Vcch equal to Vsense'. If desired, resistor 142 or other current drawing circuit may be coupled between node 140 and the ground line to help maintain stability of regulator 134.

P-channel transistors 144 and 146 may be coupled in series between power supply line 112 and node 140, whereas n-channel transistor 148 may be coupled between node 140 and the ground line. Transistor 144 may have a gate that is controlled using undershoot control signal Vus, transistor 146 may have a gate that is controlled using power-on-reset signal Vpor, and transistor 148 may have a gate that is controlled using overshoot control signal Vos. Transistor 146 may be turned off during power-on-reset operations to prevent transistor latch-up (e.g., signal Vpor may be high during device startup and low during normal operation).

Transistors 144 and 148 may respectively serve to provide voltage undershoot and overshoot protection for voltage regulating circuit 134. During transistor switching operations or other transient coupling events, current drawn from power supply line 50 may cause Vcch to instantaneously rise or fall even if temperature is not changing. It may be desirable to keep Vcch within certain limits during such transient perturbations. For example, when Vcch falls below a first predetermined threshold in response to a transient event, Vus may be driven low to help pull Vcch higher. When Vcch rises above a second predetermined threshold in response to a transient event, Vos may be driven high to help pull Vcch lower. Signals Vos and Vus may be temporarily asserted to help maintain Vcch within a desired voltage range during transient disturbances.

Voltages Vus and Vos may be generated using comparator circuits 150 and 152, respectively. Comparator circuits 150 and 152 may exhibit hysteresis (e.g., comparator circuit 150 and 152 may turn on and off at different thresholds depending on its current state). Comparator circuit 150 may have a first input that is coupled to node 140 and a second input operable to receive undershoot reference voltage signals (Vsense' minus $\Delta V$) and (Vsense' minus $2\Delta V$) over path 156. Comparator circuit 152 may have a first input that is coupled to node 140 and a second input operable to receive overshoot reference voltage signals (Vsense' plus $\Delta V$) and (Vsense' plus $2\Delta V$) over path 158. Power supply circuitry 100 may include overshoot-undershoot voltage reference generator (or reference voltage generator) 154 that receives Vsense' from the output of multiplexer 130 through buffer 132 and that is used to generate the overshoot-undershoot reference voltage signals.

Consider a scenario in which Vsense' is currently 1.05 V and voltage difference $\Delta V$ is set to be 10 mV. In this example, voltage reference generator 154 may generate overshoot voltage reference signals that are 1.15 V and 1.25 V and undershoot voltage reference signals that are 0.95 V and 0.85 V. These voltage reference signals may be used by comparator circuits 150 and 152 to determine when to enable/disable transistor 144 for transient undershoot protection and when to enable/disable transistor 148 for transient overshoot protection.

The circuit implementation of temperature dependent power supply circuitry 100 is merely illustrative and does not serve to limit the scope of the present invention. If desired, power supply circuitry 100 may be configured to sense temperature from any number of locations on device 10, may provide other types of voltage clamping mechanisms, may provide other types of voltage overshoot-undershoot protection mechanisms, etc.

Figure 6:
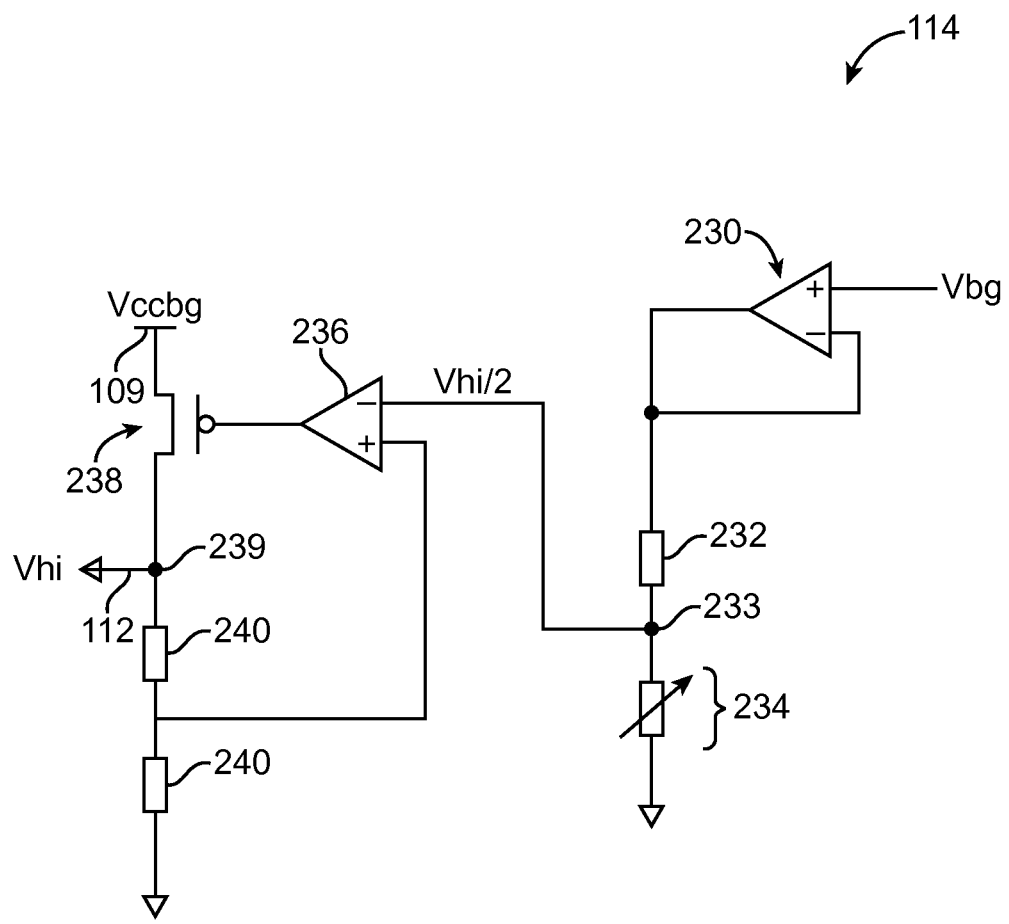
FIG. 6 is a circuit diagram of an illustrative level converting circuit in accordance with an embodiment of the present invention.

FIG. 6 is a circuit diagram of voltage level converting circuit 114 (e.g., a voltage converter operable to receive Vbg at its input and operable to generate Vhi that is greater than Vbg at its output 239). As shown in FIG. 6, voltage converter 114 may include amplifiers 230 and 236, p-channel transistor 238, and resistive circuits 240, 232, and 234 (e.g., resistors). Amplifier 230 may have a first input that receives bandgap voltage Vbg and a second input that is coupled to its output. Resistors 232 and 234 may be connected in series between the output of amplifier 230 and the ground line. Resistor 234 may be an adjustable resistive circuit and may be tuned such that node 233 at which resistors 232 and 234 are connected exhibits a voltage level that is equal to Vhi/2.

Amplifier 236 may have a first (positive) input, a second (negative) input that is coupled to node 233, and an output. Transistor 238 may be coupled between band gap power supply line 109 (e.g., a power supply line on which voltage Vccbg is provided) and output terminal 239 of circuit 114 (e.g., an output terminal that is coupled to path 112 on which Vhi is provided) and may have a gate that is coupled to the output of amplifier 236. First and second resistors 240 may be coupled between output terminal 239 and the ground line. The node at which first and second resistors are connected may be coupled to the first input of amplifier 236. First and second resistors 240 may have the same resistive value, thereby setting output 239 to exhibit the desired voltage level of Vhi. If desired, any other type of DC-to-DC converters (i.e., circuits that convert a source of direct current from one voltage level to another) may be used.

Figure 7:
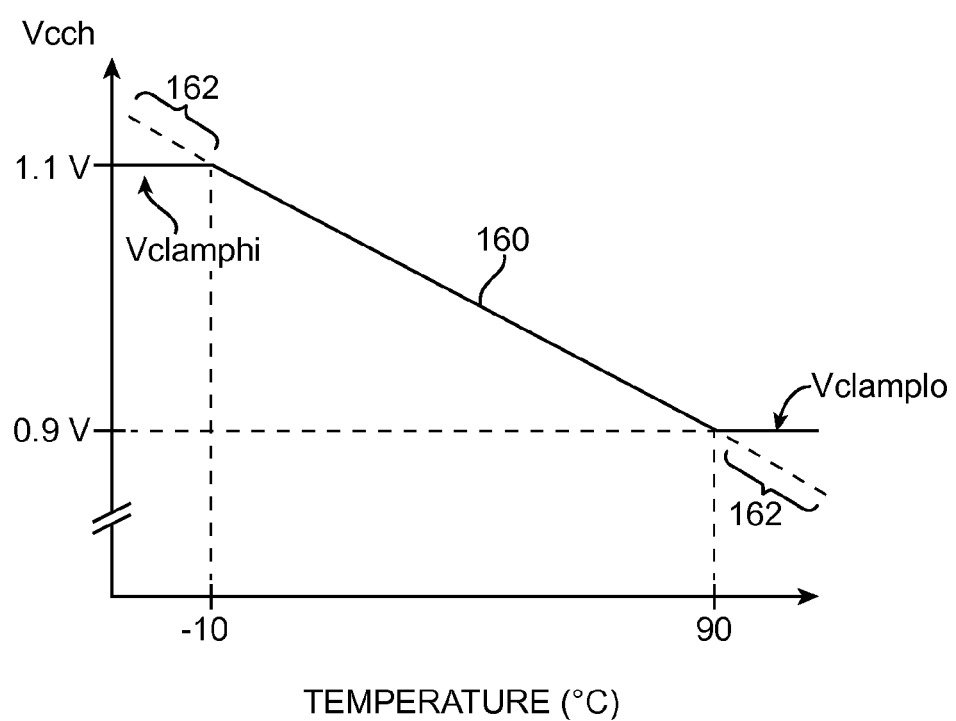
FIG. 7 is a plot of temperature dependent power supply voltage versus temperature in accordance with an embodiment of the present invention.

FIG. 7 shows how Vcch may vary as a function of temperature. BJT-based (diode based) temperature sensors such as those described in connection with FIG. 4 (e.g., temperature sensors 102-1, 102-2, and 102-3) may be used to generate a voltage level that varies inversely with temperature. As shown in FIG. 7, the voltage level provided by diode-based temperature sensors may exhibit a temperature coefficient of $-2$ mV/° C. (e.g., temperature dependent voltage signals generated using sensors 102-1, 102-2, and 102-3 may decrease linearly by 2 mV for every 1° C. increase in temperature).

For example, Vcch may be equal to 1.1 V at $-10°$ C. and may be equal to 0.9 V at 90° C., as indicated by line 160. As discussed previously, if Vsense exceeds Vclamphi (which is equal to 1.1 V in this example), Vcch is clamped to a fixed voltage level of 1.1 V. Similarly, if Vsense falls below Vclamplo (which is equal to 0.9 V in this example), Vcch is clamped to a fixed voltage level of 0.9 V. As indicated by dotted portions 162 in FIG. 7, Vcch may extend above Vclamphi at lower temperatures and may extend below Vclamplo at higher temperatures if voltage clipping circuitry is switched out of use. If voltage clipping circuitry is enabled (e.g., if clamp voltage generation and control circuitry 120 is configured properly), Vcch may be set to Vclamphi when the operating temperature falls below $-10°$ C. and may be set to Vclamplo when the operating temperature rises above 90° C.

Figure 8:
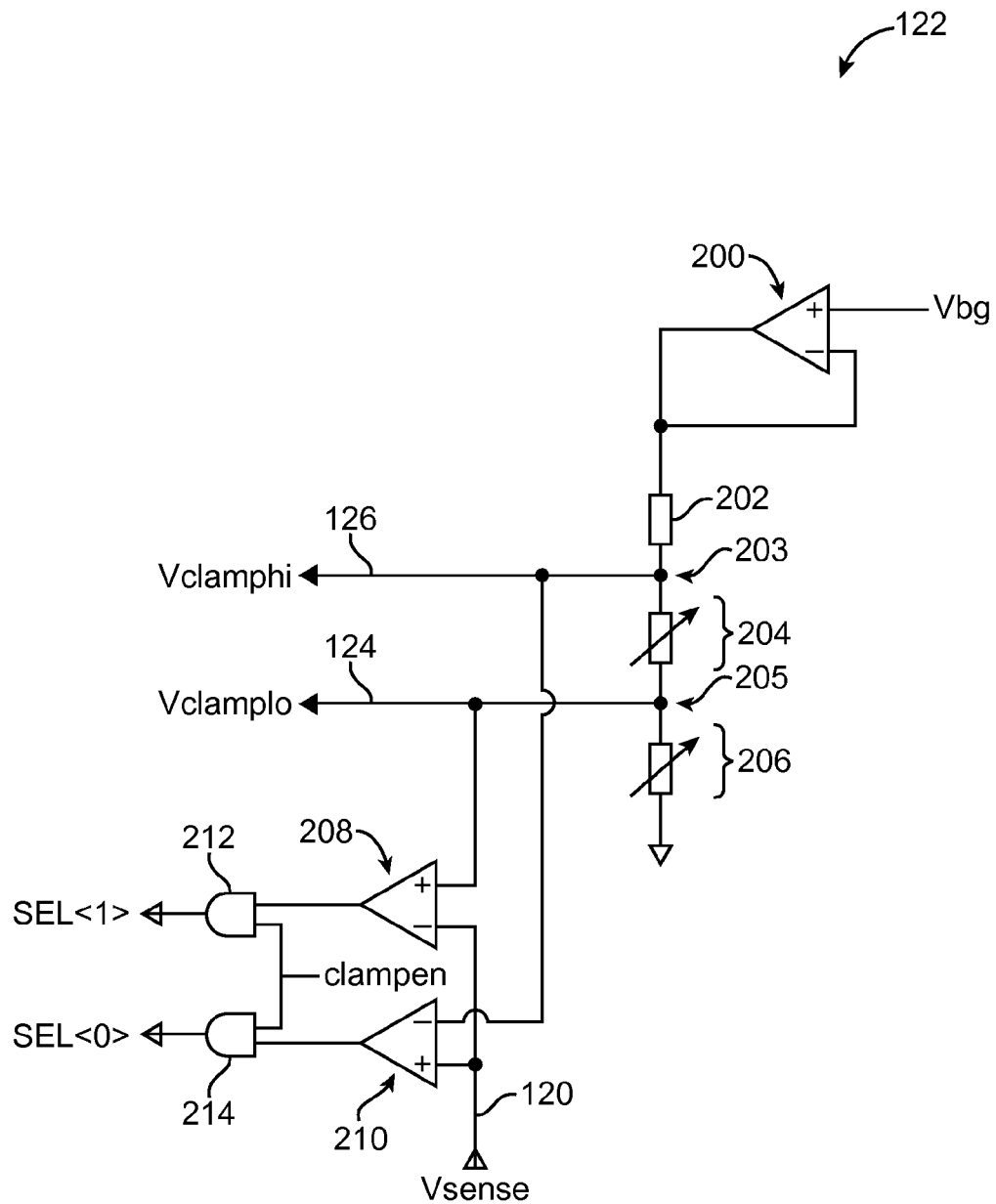
FIG. 8 is a circuit diagram of illustrative clamp voltage generation and control circuitry in accordance with an embodiment of the present invention.

FIG. 8 shows one possible circuit implementation of clamp voltage generation and control circuitry 122. As shown in FIG. 8, circuitry 122 may include amplifier circuits 200, 208, and 210, resistive circuits (e.g., resistors) 202, 204, and 206, and logic gates such as logic AND gates 212 and 214. Amplifier 200 may have a first input configured to receive band gap voltage Vbg and a second input that is coupled to its output. Resistors 202, 204, and 206 may be coupled in series between the output of amplifier 200 and the ground line. Output path 126 on which Vclamphi is provided may be coupled to intermediate node 203 at which resistors 202 and 204 are connected. Output path 124 on which Vclamplo is provided may be coupled to intermediate node 205 at which resistors 204 and 206 are connected. Resistors 204 and 206 may be adjustable resistors and may be tuned so that Vclamphi and Vclamplo exhibit desired upper and lower clamping levels.

Amplifier 208 may have a first input coupled to node 203 (e.g., a positive input configured to receive Vclamplo over path 124), a second (negative) input configured to receive Vsense routed over path 120, and an output. Amplifier 210 may have a first (positive) input configured to receive Vsense routed over path 120, a second input coupled to node 205 (e.g., a negative input configured to receive Vclamphi over path 126), and an output. Logic AND gate 212 may have a first input coupled to the output of amplifier 208, a second input that is controlled by signal clampen, and an output on which signal SEL<1> is provided. Logic AND gate 214 may have a first input coupled to the output of amplifier 210, a second input that is controlled by signal clampen, and an output on which signal SEL<0> is provided. Signal clampen may be asserted (e.g., clampen may be driven high) to enable clamp voltage generation and control circuitry 122. Signal clampen may be deasserted (e.g., clampen may be driven low) to disable clamp voltage generation and control circuitry 122.

Signal SEL generated in this way (SEL<1> as the more significant bit and SEL<0> as the less significant bit) may configure multiplexer 130 to route a voltage signal selected from one of its first (00), second (01), and third (10) inputs to its output. As an example, if Vsense is less than Vclamplo, signal SEL may be driven to "10" to set Vsense' equal to Vclamplo. If Vsense is greater than Vclamphi, signal SEL may be driven to "01" to set Vsense' equal to Vclamphi. If Vsense is greater than Vclamplo and less than Vclamphi, signal SEL may be driven to "00" to set Vsense' equal to Vsense. The implementation of circuitry 122 in FIG. 8 is merely illustrative and does not serve to limit the scope of the present invention. If desired, other circuits suitable for setting predetermined limits for Vcch as temperature varies may be used.

Figure 9:
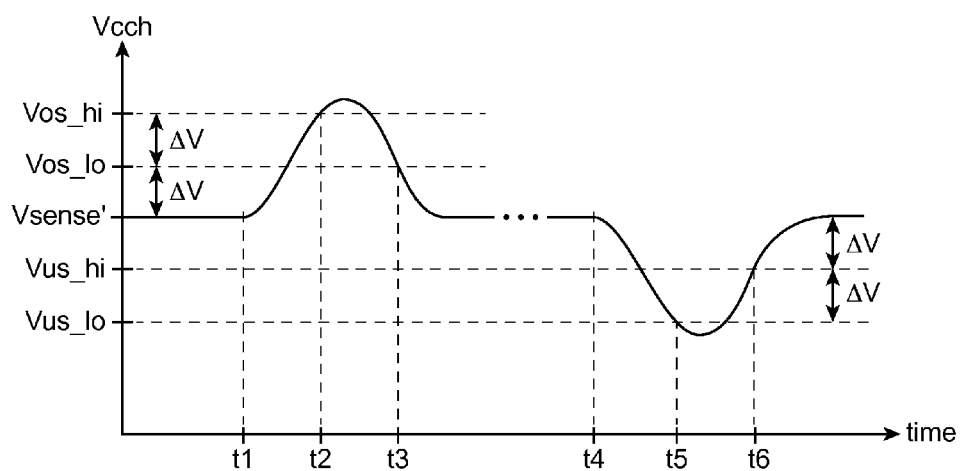
FIG. 9 is a timing diagram illustrating the operation of voltage overshoot-undershoot protection circuitry in accordance with an embodiment of the present invention.

FIG. 9 is a timing diagram showing how Vcch may vary in the presence of transient disturbances caused by parasitic coupling, transistor switching operations, etc. Consider in the example of FIG. 9 that Vcch is between Vclamplo and Vclamphi and that temperature is relatively constant (i.e., Vcch is nominally equal to Vsense'). At time t1, a first transient disturbance may cause Vcch to rise instantaneously. In response to detecting that Vcch exceeds overshoot threshold Vos_hi (i.e., Vsense' plus 2ΔV) at time t2, overshoot protection signal Vos may be asserted to turn on transistor 148 to help pull Vcch back down (see, e.g., FIG. 5). Signal Vos may stay asserted until Vcch falls below Vos_lo (i.e., Vsense' plus ΔV) at time t3. Using comparator circuit 152 with hysteresis in this way may help prevent transistor 148 from excessively discharging Vcch.

At time t4, a second transient disturbance may cause Vcch to fall instantaneously. In response to detecting that Vcch falls below undershoot threshold Vus_lo (i.e., Vsense' minus 2ΔV) at time t5, undershoot protection signal Vus may be asserted to turn on transistor 144 to help pull Vcch back up. Signal Vus may stay asserted until Vcch rises above Vus_hi (i.e., Vsense' minus ΔV) at time t6. Using comparator circuit 150 with hysteresis in this way may help prevent transistor 144 from excessively pulling up Vcch. Providing overshoot protection (as shown from time t1 to t3) and undershoot protection (as shown from time t4 to t6) as described in connection with FIG. 9 way may help maintain Vcch within +/−2ΔV of the current value of Vsense' in the presence of transient perturbations.

Figure 10:
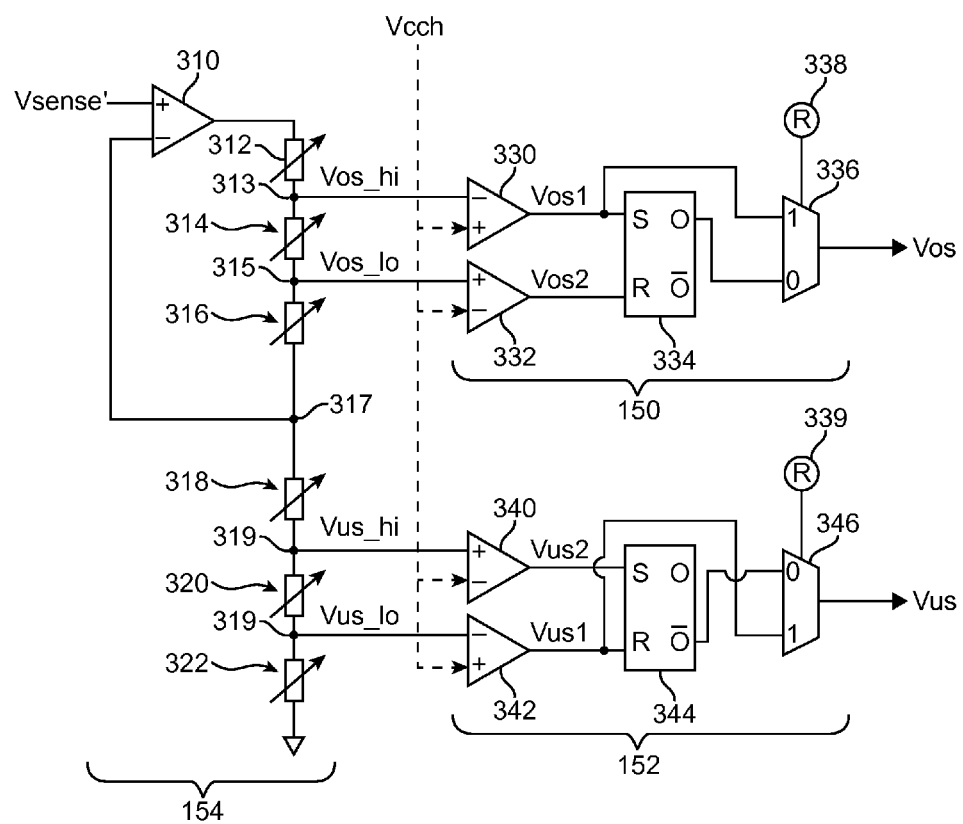
FIG. 10 is a circuit diagram of illustrative voltage overshoot-undershoot protection circuitry in accordance with an embodiment of the present invention.

FIG. 10 shows one suitable arrangement of overshoot-undershoot protection circuitry. As shown in FIG. 10, overshoot-undershoot protection circuitry may include voltage reference generator 154 and comparator circuits 150 and 152. Overshoot-undershoot voltage reference generator 154 may include amplifying circuit 310 and a resistive chain containing resistors 312, 314, 316, 318, 320, and 322. Amplifier 310 may have a first input configured to receive Vsense', a second input, and an output. Resistors 312, 314, 316, 318, 320, and 322 in the resistive chain may be coupled in series between the output of amplifier 310 and the ground line. Node 313 may represent a connection at which resistor 312 connects to resistor 314. Node 315 may represent a connection at which resistor 314 connects to 316. Node 317 may represent a connection at which resistor 316 connects to 318. Node 319 may represent a connection at which resistor 318 connects to 320. Node 321 may represent a connection at which resistor 320 connects to 322. The second input of amplifier 310 may be coupled to node 317. Resistors 314, 316, 318, 320, and 322 may be adjustable resistors and may be tuned so that voltage Vos_hi is provided at node 313, so that voltage Vos_lo is provided at node 315, so that voltage Vus_hi is provided at node 319, and so that voltage Vus_lo is provided at node 321 (e.g., so that the voltage drop across each of resistors 314, 316, 318, and 320 is equal to the desired ΔV).

Comparator circuit 150 may include amplifiers 330 and 332, a latching circuit such as a set-reset latch 334, and multiplexer 336. Amplifier 330 may have a first (positive) input configured to receive Vcch over a feedback path, a second (negative) input configured to receive Vos_hi from node 313, and an output on which signal Vos1 is generated. Signal Vos1 may be high if Vcch is greater than Vos_hi and may be low if Vcch is less than Vos_hi. Amplifier 332 may have a first (positive) input configured to receive Vos_lo from node 315, a second (negative) input configured to receive Vcch over the feedback path, and an output on which signal Vos2 is generated. Signal Vos2 may be high if Vcch is less than Vos_lo and may be low if Vcch is greater than Vos_lo.

Set-reset (SR) latch 334 may have a first (set) input configured to receive Vos1 from the output of amplifier 330, a second (reset) input configured to receive Vos2 from the output of amplifier 332, and a non-inverting output. The operation of SR latch 334 may be summarized in the truth table of FIG. 11. As shown in column 350 of FIG. 11, SR latch 334 may retain its current value if it receives a "0" at its first input and a "0" at its second input, may drive its non-inverting output (O) high if it receives "0" at its first input and a "1" at its second input, and may drive its non-inverting output low if it receives "1" at its first input and a "0" at its second input.

Multiplexer 336 of comparator 150 may have a first input coupled to the non-inverting output of SR latch 334, a second input configured to receive Vos1 from the output of amplifier 330, a control input that receives a control bit stored on memory element 338, and an output on which signal Vos is provided. Memory element 338 may be a RAM cell, fuse, antifuse, programmable read-only-memory memory cell, mask-programmed and laser-programmed structure, etc. If memory element 338 is configured to stored a logic "0," comparator 150 may exhibit hysteresis (e.g., overshoot protection circuitry may be turned on when Vcch exceeds Vos_hi and may be turned off when Vcch falls below Vos_lo, where Vos_lo is different than Vos_hi). If memory element 338 is configured to store a logic "1," the hysteresis capability of comparator 150 may be disabled (e.g., overshoot protection circuitry may be turned on when Vcch exceeds Vos_hi and may be turned off when Vcch falls below Vos_hi). Overshoot protection control signal Vos generated using this configuration may be fed to the gate of pull-down transistor 148 in voltage regulating circuit 134 (see, e.g., FIG. 5).

Comparator circuit 152 may include amplifiers 340 and 342, a latching circuit such as a set-reset latch 344, and multiplexer 346. Amplifier 340 may have a first (positive) input configured to receive Vus_hi from node 319, a second (negative) input configured to receive Vcch over the feedback path, and an output on which signal Vus2 is generated. Signal Vus2 may be low if Vcch is greater than Vus_hi and may be high if Vcch is less than Vus_hi. Amplifier 342 may have a first (positive) input configured to receive Vcch over the feedback path, a second (negative) input configured to receive Vus_lo from node 319, and an output on which signal Vus1 is generated. Signal Vus1 may be low if Vcch is less than Vus_lo and may be high if Vcch is greater than Vus_lo.

SR latch 344 may have a first (set) input configured to receive Vus2 from the output of amplifier 340, a second (reset) input configured to receive Vus1 from the output of amplifier 342, and an inverting output. The operation of SR latch 344 may be summarized in the truth table of FIG. 11. As shown in column 352 of FIG. 11, SR latch 344 may retain its current value if it receives a "0" at its first input and a "0" at its second input, may drive its inverting output (/O) low if it receives "0" at its first input and a "1" at its second input, and may drive its inverting output high if it receives "1" at its first input and a "0" at its second input.

Multiplexer 346 of comparator 152 may have a first input coupled to the inverting output of SR latch 344, a second input configured to receive Vus1 from the output of amplifier 342, a control input that receives a control bit stored on memory element 339, and an output on which signal Vus is provided. Memory element 339 may be a RAM cell, fuse, antifuse, programmable read-only-memory memory cell, mask-programmed and laser-programmed structure, etc. If memory element 339 is configured to stored a logic "0," comparator 152 may exhibit hysteresis (e.g., undershoot protection circuitry may be turned on when Vcch falls below Vus_lo and may be turned off when Vcch exceeds Vus_hi, where Vus_lo is different than Vus_hi). If memory element 339 is configured to store a logic "1," the hysteresis capability of comparator 152 may be disabled (e.g., undershoot protection circuitry may be turned on when Vcch falls below Vus_lo and may be turned off when Vcch exceeds Vus_lo). Voltage undershoot protection control signal Vus generated using this configuration may be fed to the gate of pull-up transistor 144 in voltage regulating circuit 134 (see, e.g., FIG. 5).

In general, power supply circuitry 100 that is used to generate temperature dependent time-varying power supply voltage Vcch need not only be supplied to memory cells but may also be supplied to other suitable integrated circuit components formed on device 10.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
   a plurality of temperature sensing circuits that generate respective temperature dependent voltage signals;
   a multiplexing circuit that receives the temperature dependent voltage signals from the plurality of temperature sensing circuits and provides a temperature dependent power supply voltage at its output; and
   an additional multiplexer circuit that receives the temperature dependent power supply voltage from the output of the multiplexer, that receives first and second fixed clamping voltages, and that generates a temperature dependent output voltage.

2. The integrated circuit defined in claim 1 wherein the plurality of temperature sensing circuits are formed at different regions on the integrated circuit.

3. The integrated circuit defined in claim 1 wherein the multiplexing circuit is configured to route a selected one of the temperature dependent voltage signals to its output so that the temperature dependent power supply voltage has a voltage level equal to that of the selected temperature dependent voltage signal.

4. The integrated circuit defined in claim 1 further comprising:
   voltage clamping circuitry that sets the temperature dependent output voltage to the first fixed clamping voltage when the temperature dependent power supply voltage exceeds the first fixed clamping voltage and that sets the temperature dependent output voltage to the second fixed clamping voltage when the temperature dependent power supply voltage is less than the second fixed clamping voltage.

5. The integrated circuit defined in claim 4 wherein the voltage clamping circuitry comprises:
   a resistive chain, wherein the first fixed clamping voltage is provided at a first intermediate node in the resistive chain and wherein the second fixed clamping voltage is provided at a second intermediate node in the resistive chain;
   a first amplifying circuit that receives the first fixed clamping voltage and the temperature dependent power supply voltage and that generates a first portion of a control signal that is used to configure the additional multiplexing circuit; and
   a second amplifying circuit that receives the second fixed clamping voltage and the temperature dependent power supply voltage signal and that generates a second portion of the control signal.

6. The integrated circuit defined in claim 4, further comprising:
   voltage overshoot-undershoot protection circuitry operable to reduce the voltage change in the temperature dependent output voltage.

7. The integrated circuit defined in claim 1, further comprising:
   voltage overshoot-undershoot protection circuitry operable to reduce the voltage change in the temperature dependent output voltage.

8. The integrated circuit defined in claim 7 further comprising:
   a voltage regulating circuit that is coupled to the additional multiplexing circuit and that is coupled to the voltage overshoot-undershoot protection circuitry.

9. The integrated circuit defined in claim 1 wherein at least one of the plurality of temperature sensing circuits comprises a bipolar junction transistor.

10. A method for using power supply circuitry having a voltage regulating circuit and a reference voltage generator, the method comprising:
    with the voltage regulating circuit, generating a temperature dependent power supply voltage on an output line;
    with the reference voltage generator, generating a first voltage; and
    in response to detecting that the temperature dependent power supply voltage is rising, turning on a first transistor to reduce the voltage rise of the temperature dependent power supply voltage by coupling a ground line to the output line associated with the temperature dependent power supply voltage when the temperature dependent power supply voltage exceeds the first voltage.

11. The method defined in claim 10 further comprising:
    with the reference voltage generator, generating a second voltage that is less than the first voltage; and
    in response to detecting that the temperature dependent power supply voltage is dropping in voltage as a result of turning on the first transistor, turning off the first transistor when the temperature dependent power supply voltage drops below the second voltage.

12. The method defined in claim 11 further comprising:
    with the reference voltage generator, generating a third voltage that is less than the second voltage; and
    in response to detecting that the temperature dependent power supply voltage is dropping, turning on a second transistor to reduce the voltage drop of the temperature dependent power supply voltage when the temperature dependent power supply voltage drops below the third voltage.

13. The method defined in claim 12 further comprising:
    with the reference voltage generator, generating a fourth voltage that is greater than the third voltage and that is less than the second voltage; and
    in response to detecting that the temperature dependent power supply voltage is rising in voltage as a result of turning on the second transistor, turning off the second transistor when the temperature dependent power supply voltage exceeds than the fourth voltage.

14. The method defined in claim 10 wherein turning on the first transistor comprises turning on an n-channel transistor.

15. The method defined in claim 12 wherein turning on the second transistor comprises turning on a p-channel transistor.

16. Power supply circuitry operable to generate a temperature dependent power supply voltage comprising:
    a reference voltage generator operable to generate a first voltage;
    a first circuit operable to receive the first voltage and the temperature dependent power supply voltage and operable to assert a first control signal in response to detecting that the temperature dependent power supply voltage exceeds the first voltage; and a first transistor having a gate that is controlled by the first control signal, wherein the first transistor is used to reduce the temperature dependent power supply voltage.

17. The power supply circuitry defined in claim 16 wherein the reference voltage generator is further operable to generate a second voltage that is less than the first voltage and wherein the power supply circuitry further comprises:

a second circuit operable to receive the second voltage and the temperature dependent power supply voltage and operable to assert a second control signal in response to detecting that the temperature dependent power supply voltage drops below the second voltage; and a second transistor having a gate that is controlled by the second control signal, wherein the second transistor is used to increase the temperature dependent power supply voltage.

18. The power supply circuitry defined in claim 17 wherein the reference voltage generator comprises a resistive chain, wherein the first voltage is provided at a first intermediate node in the resistive chain, and wherein the second voltage is provided at a second intermediate node in the resistive chain.

19. The power supply circuitry defined in claim 17 wherein the first circuit comprises a first latching circuit and at least a first amplifying circuit operable to receive the first voltage and the temperature dependent power supply voltage and wherein the second circuit comprises a second latching circuit and at least a second amplifying circuit operable to receive the second voltage and the temperature dependent power supply voltage.

20. The power supply circuitry defined in claim 19 where in the first and second latching circuits comprise set-reset latches.

21. The power supply circuitry defined in claim 17 wherein the first transistor comprises an n-channel transistor and wherein the second transistor comprises a p-channel transistor.

* * * * *